(12) United States Patent
Lianto et al.

(10) Patent No.: US 9,922,874 B2
(45) Date of Patent: Mar. 20, 2018

(54) METHODS OF ENHANCING POLYMER ADHESION TO COPPER

(71) Applicant: APPLIED MATERIALS, INC., Santa Clara, CA (US)

(72) Inventors: Prayudi Lianto, Singapore (SG); Sam Lee, Kalispell, MT (US); Charles Sharbono, Whitefish, MT (US); Marvin Louis Bernt, Kalispell, MT (US); Guan Huei See, Singapore (SG); Arvind Sundarrajan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/200,836

(22) Filed: Jul. 1, 2016

(65) Prior Publication Data

US 2018/0005881 A1 Jan. 4, 2018

(51) Int. Cl.
*H01L 21/768* (2006.01)
*H01L 23/532* (2006.01)
*H01L 23/522* (2006.01)

(52) U.S. Cl.
CPC .. *H01L 21/76879* (2013.01); *H01L 21/76804* (2013.01); *H01L 21/76873* (2013.01);
(Continued)

(58) Field of Classification Search
USPC .......................................................... 438/623
See application file for complete search history.

(56) References Cited

U.S. PATENT DOCUMENTS

2006/0070885 A1  4/2006  Uzoh et al.
2008/0000678 A1  1/2008  Johnston et al.
(Continued)

FOREIGN PATENT DOCUMENTS

KR  10-0780772 B1  11/2007

OTHER PUBLICATIONS

Yuki Nakamura, Noritaka Matsuie, Takeharu Motobe, Improvement in Adhesion Strength of Positive-tone Photo-definable Poly(benzoxazole), Technology Development Center Hitachi Chemical DuPont MicroSystems, 33 pages.

Sam Siau, Alfons Vervaet, Luc Van Vaeck, Etienne Schacht,C Ulric Demeter, and Andre Van Calster, Adhesion Strength of the Epoxy Polymer/Copper Interface for Use in Microelectronics, Journal of The Electrochemical Society, 152 (6) C442-C455 (2005) 0013-4651/2005/152(6)/C442/14/$7.00 © The Electrochemical Society, Inc., 14 pages.

(Continued)

*Primary Examiner* — Marcos D Pizarro Crespo
*Assistant Examiner* — Lawrence Tynes, Jr.
(74) *Attorney, Agent, or Firm* — Moser Taboada; Alan Taboada

(57) ABSTRACT

A method of processing a semiconductor substrate includes: immersing a substrate in a first bath, wherein the substrate comprises a barrier layer, a conductive seed layer, and a patterned photoresist layer defining an opening; providing a first electric current between the conductive seed layer and a first anode disposed in electrical contact with the first bath to deposit a conductive material within the opening; stripping the patterned photoresist layer; immersing the substrate in a second bath; providing a second electric current that is a reverse of the first electric current between the conductive seed layer plus the conductive material and a second anode disposed in electrical contact with the second bath; etching the conductive seed layer from atop a field region of the barrier layer; and etching the barrier layer from atop a field region of the substrate.

20 Claims, 4 Drawing Sheets

(52) U.S. Cl.
CPC ...... *H01L 23/5226* (2013.01); *H01L 23/5329* (2013.01); *H01L 23/53228* (2013.01)

(56) References Cited

U.S. PATENT DOCUMENTS

| | | | |
|---|---|---|---|
| 2014/0199497 A1 | 7/2014 | Spurlin et al. | |
| 2014/0238868 A1* | 8/2014 | Li | C09D 179/02 205/296 |
| 2014/0357089 A1* | 12/2014 | Buckalew | H01L 21/02052 438/745 |
| 2015/0075606 A1* | 3/2015 | Lee | H01L 51/442 136/256 |
| 2015/0225866 A1* | 8/2015 | Lee | C25D 5/48 205/221 |
| 2015/0325803 A1* | 11/2015 | Lee | H01L 51/442 257/40 |

OTHER PUBLICATIONS

A. Zee, R. Massey, H. Reischer, Impact of Surface Treatment on High Frequency Signal Loss Characteristics, pp. 474-477, 2009 IEEE.

Yuriy Shlepnev, Modeling frequency-dependent conductor losses and dispersion in serial data channel interconnects, Simberian Inc., www.simberian.com 2007, 12 pages.

Chad Roberts, Polyimide and polybenzoxazole technology for wafer-level packaging, Chip Scale Review Jul. Aug. 2015, HD Microsystems, pp. 26-31.

International Search Report and Written Opinion dated Aug. 30, 2017 for PCT Application No. PCT/US2017/036444.

* cited by examiner

METHODS OF ENHANCING POLYMER ADHESION TO COPPER

FIELD

Embodiments of the present disclosure generally relate to methods for enhancing polymer adhesion to copper.

BACKGROUND

Wafer level packaging utilizing multilayer polymer/copper (Cu) architecture has been popularly applied in making semiconductor chip products due to the high performance and low cost provided. However, there are still some issues, such as structural delamination between adjacent polymer and copper layers.

Accordingly, the inventors have developed improved methods for enhancing polymer adhesion to copper.

SUMMARY

Methods of enhancing polymer adhesion to copper are provided herein. In some embodiments, a method of processing a semiconductor substrate includes: immersing a substrate in a first bath, wherein the substrate comprises a barrier layer, a conductive seed layer atop the barrier layer, and a patterned photoresist layer atop the conductive seed layer defining an opening formed to a top surface of the conductive seed layer, and wherein the first bath comprises a solution of at least one acid, a copper-containing compound, and at least one additive; providing a first electric current between the conductive seed layer and a first anode disposed in electrical contact with the first bath to deposit a conductive material within the opening; stripping the patterned photoresist layer to expose a portion of the conductive seed layer formed atop a field region of the barrier layer and to expose sidewalls of the conductive material; immersing the substrate in a second bath, wherein the second bath comprises a solution of at least one acid and a copper-containing compound without any additives; providing a second electric current that is a reverse of the first electric current between the conductive seed layer plus the conductive material and a second anode disposed in electrical contact with the second bath; etching the conductive seed layer from atop a field region of the barrier layer; and etching the barrier layer from atop a field region of the substrate.

In some embodiments, a method of processing a semiconductor substrate includes: immersing a substrate in a first bath comprising copper sulfate ($CuSO_4$), sulfuric acid ($H_2SO_4$), hydrogen chloride (HCl), and one or more additives, wherein the substrate comprises a barrier layer, a conductive seed layer atop the barrier layer, and a patterned photoresist layer atop the conductive seed layer defining an opening formed to a top surface of the conductive seed layer; providing a first electric current between the conductive seed layer and a first anode disposed in electrical contact with the first bath to deposit a conductive material within the opening; stripping the patterned photoresist layer to expose a portion of the conductive seed layer formed atop a field region of the barrier layer and to expose sidewalls of the conductive material; etching the conductive seed layer from atop a field region of the barrier layer; immersing the substrate in a second bath comprising copper sulfate ($CuSO_4$), sulfuric acid ($H_2SO_4$), and hydrogen chloride (HCl) without any additives; providing a second electric current that is a reverse of the first electric current between the barrier layer plus the conductive material and a second anode disposed in electrical contact with the second bath; and etching the barrier layer from atop a field region of the substrate.

In some embodiments, a method of processing a semiconductor substrate includes: immersing a substrate in a first bath comprising copper sulfate ($CuSO_4$), sulfuric acid ($H_2SO_4$), hydrogen chloride (HCl), and one or more additives, wherein the substrate comprises a barrier layer, conductive seed layer atop the barrier layer, and a patterned photoresist layer atop the conductive seed layer defining an opening formed to a top surface of the conductive seed layer; providing a first electric current between the conductive seed layer and a first anode disposed in electrical contact with the first bath to deposit a conductive material within the opening; immersing the substrate in a second bath comprising copper sulfate ($CuSO_4$), sulfuric acid ($H_2SO_4$), and hydrogen chloride (HCl) without any accelerators, suppressors, or levelers; providing a second electric current that is a reverse of the first electric current between the conductive seed layer plus the conductive material and a second anode disposed in electrical contact with the second bath; stripping the patterned photoresist layer after providing the second electric current to expose a portion of the conductive seed layer formed atop a field region of the barrier layer and to expose sidewalls of the conductive material; etching the conductive seed layer from atop a field region of the barrier layer after stripping the patterned photoresist layer; immersing the substrate in the second bath and providing the second electric current that is a reverse of the first electric current between the barrier layer plus the conductive material and the second anode disposed in electrical contact with the second bath after etching the conductive seed layer; and etching the barrier layer from atop a field region of the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Improved methods of enhancing polymer adhesion to copper are disclosed herein. Embodiments of the current disclosure advantageously reduce structural delamination between adjacent polymer and copper layers. While the inventive methods disclosed herein are discussed with respect to copper, a commonly used material for interconnect packaging, the inventive methods may also be used with any metals used in semiconductor manufacturing processes that can be electrodeposited, such as gold, nickel, cobalt, and the like. Embodiments of the current disclosure may advantageously be used in semiconductor manufacturing applications, such as (for example) fan out wafer level packaging applications.

Figure 1:
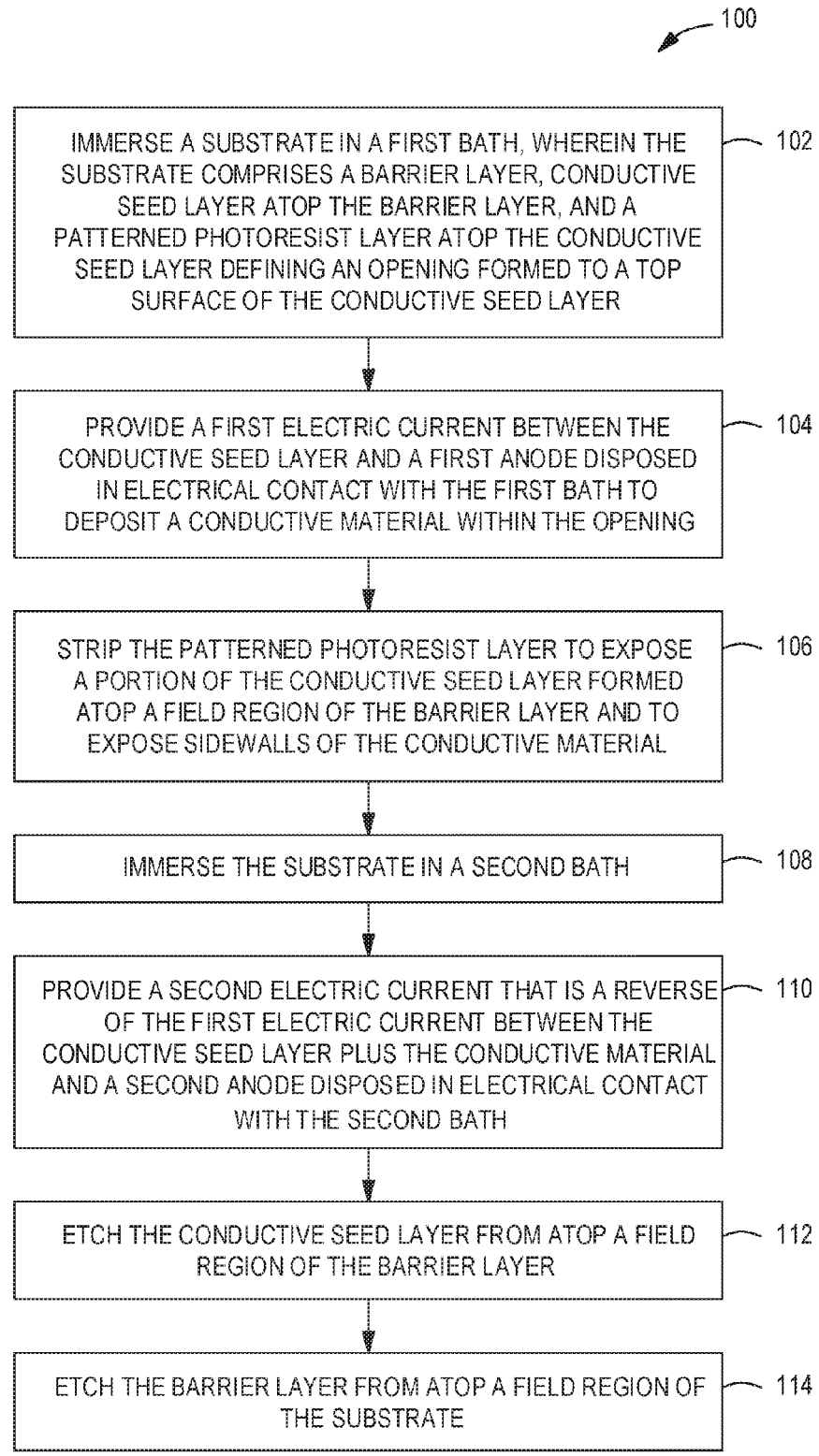
FIG. 1 depicts a flow chart for a method of processing a copper (Cu) surface to enhance polymer adhesion in accordance with some embodiments of the present disclosure.

FIG. 1 is a flow diagram of a method 100 of enhancing polymer adhesion to copper in accordance with some embodiments of the present disclosure. FIGS. 2A-2E are illustrative cross-sectional views of a substrate during different stages of the processing sequence of FIG. 1 in accordance with some embodiments of the present disclosure.

The method 100 of enhancing polymer adhesion to copper is performed on a substrate 200 as depicted in FIGS. 2A-2E. The substrate 200 may be any suitable substrate used in semiconductor device manufacturing, display or solar applications, such as a semiconductor wafer, an epoxy mold compound wafer, a reconstituted wafer (chip on mold), an organic substrate, a liquid crystal display (LCD) or a glass substrate. In some embodiments, the substrate 200 may have various dimensions, such as 200 or 300 mm diameter wafers, as well as rectangular or square panels. In some embodiments, the substrate 200 may be any substrate suitable for forming a semiconductor device, such as a transistor, which when completed may be, for example, a field effect transistor (FET), a fin field effect transistor (FinFET), a flash memory device, or the like. In some embodiments, the substrate 200 may comprise a material such as crystalline silicon (e.g., Si<100>, Si<110> or Si<111>), silicon oxide, strained silicon, silicon germanium, doped or undoped polysilicon, doped or undoped silicon wafers, patterned or non-patterned wafers, patterned or non-patterned polymer, silicon on insulator (SOI), carbon doped silicon oxides, silicon nitride, doped silicon, germanium, gallium arsenide, glass, sapphire, or the like.

Figure 2A:
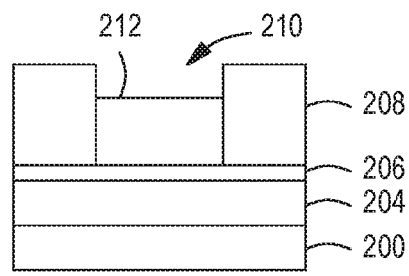
FIGS. 2A-2E depict a schematic side view of a substrate during different stages of processing a copper (Cu) surface to enhance polymer adhesion in accordance with some embodiments of the present disclosure.

As depicted in FIG. 2A, the substrate 200 comprises a barrier layer 204 formed atop the substrate 200. The barrier layer 204 may be any suitable barrier layer 204 used in semiconductor manufacturing processes, such as titanium, tantalum, titanium nitride, tantalum nitride, or the like. The barrier layer 204 may be deposited using any suitable deposition process, for example a physical vapor deposition process (PVD), a chemical vapor deposition process (CVD), an atomic layer deposition process (ALD), or the like. The thickness of the barrier layer can be about 50 to about 200 nm.

The substrate 200 further comprises a conductive seed layer 206 formed atop the barrier layer 204. In some embodiments, the conductive seed layer is copper. The conductive seed layer 206 may be deposited using any suitable deposition process, for example a physical vapor deposition process (PVD), a chemical vapor deposition process (CVD), an atomic layer deposition process (ALD), or the like. The thickness of the conductive seed layer is less than about 200 nm, for example about 50 to about 200 nm.

The substrate 200 further comprises a patterned photoresist layer 208 defining an opening 210 through the patterned photoresist layer 208 to expose the underlying layers such as the conductive seed layer 206. In some embodiments, the patterned photoresist layer 208 may be a positive or negative photoresist and/or a DUV or EUV (deep ultraviolet or extreme ultraviolet) photoresist and may comprise one or more of polymers, organic compounds (e.g., comprising carbon, hydrogen and oxygen), an amorphous carbon, such as Advanced Patterning Film (APF), available from Applied Materials, Inc., located in Santa Clara, Calif., a tri-layer resist (e.g., a photoresist layer, a Si-rich anti-reflective coating (ARC) layer, and a carbon-rich ARC, or bottom ARC (BARC) layer), a spin-on hardmask (SOH), or the like. The patterned photoresist layer 208 may be formed by any suitable process, for example, a patterned etch process, spin coating process, optical lithography techniques, or the like.

The method 100 of processing a substrate to enhance polymer adhesion to copper generally begins at 102 by immersing the substrate 200 in a first bath (i.e. a plating bath). The first bath comprises one or more acids such as sulfuric acid ($H_2SO_4$), hydrogen chloride (HCl), or the like, a copper-containing compound, such as copper sulfate ($CuSO_4$) or copper fluoroborate ($CuB_2F_8$), and one or more additives. Examples of suitable additives include: corrosion inhibitors such as benzotriazole (BTA) and benzotriazole (BTA) variants, halogens (ex. chlorine), inhibitors or suppressors, accelerators or brighteners, levelers, acetic acid, benzoic acid, citrazinic acid, citric acid, glycerol, ethylene glycol, alcohol (such as methanol, ethanol), and surfactants. In some embodiments, the one or more additives comprise one or more of at least one accelerator-suppressor and at least one leveler. In some embodiments, the first bath comprises about 30 to about 85 grams/liter of copper sulfate ($CuSO_4$), about 50 to about 150 grams/liter of sulfuric acid ($H2SO_4$), about 30 to about 150 parts per million of hydrogen chloride (HCl). The first bath further comprises a suitable amount of additives to provide suitable plating properties depending on the specific semiconductor manufacturing application.

Next at 104, a first electric current is provided between the conductive seed layer 206 and a first anode disposed in electrical contact with the first bath to deposit a conductive material 212 at the bottom of the opening 210. In some embodiments, the conductive material 212 is the same material as the conductive seed layer 206. In some embodiments, the conductive material 212 is one of copper, gold, nickel, cobalt, or the like. In some embodiments, the conductive material 212 is copper. In some embodiments, as depicted in FIG. 2A, the opening 210 is only partially filled with the conductive material 212. In some embodiments, the conductive material 212 has a thickness of about 3 to about 8 μm. In some embodiments, the substrate 200 is immersed in the first bath for a first period of time of about 1 to about 10 minutes. In some embodiments, the first electric current is about 0.5 to about 20 Amps. The first electric current is provided by a power source such as a DC power source.

At 106, the patterned photoresist layer 208 is stripped to expose the conductive seed layer 206 on the field region 214 of the barrier layer 204 and to expose the sidewalls 216 of the conductive material 212. The patterned photoresist layer 208 may be stripped using any suitable photoresist etching method used in semiconductor manufacturing processes. For example, the patterned photoresist layer 208 may be exposed to a wet etch process using for example alkaline solutions.

Figure 2B:
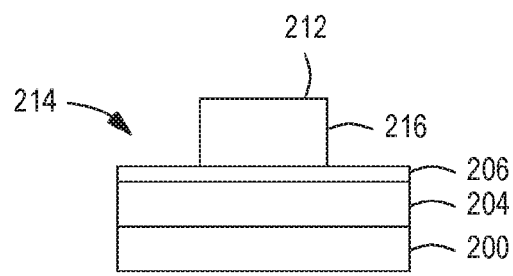
Figure 4A:
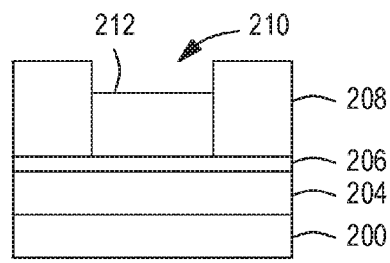
FIGS. 4A-4F depict a schematic side view of a substrate during different stages of processing a copper (Cu) surface to enhance polymer adhesion in accordance with some embodiments of the present disclosure.
Figure 4B:
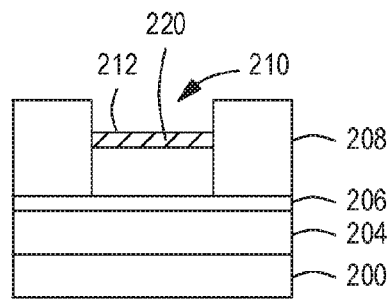
Figure 4C:
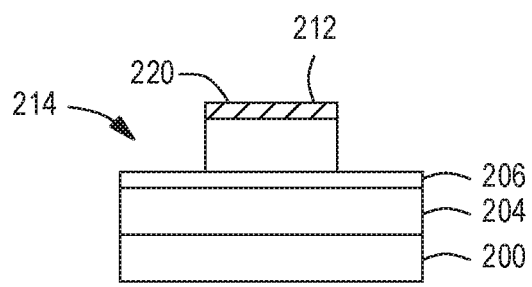

In some embodiments, the patterned photoresist layer 208 is stripped prior to immersing the substrate 200 in the second bath as described below at 108. In some embodiments, the patterned photoresist layer 208 is stripped after providing the second electric current as described at 110 below. As depicted in FIG. 2B or FIG. 4C, in either embodiment, the patterned photoresist layer 208 is stripped to expose the conductive seed layer 206 on the field region 214 of the barrier layer 204 and to expose the sidewalls 216 of the conductive material 212.

At 108, the substrate 200 is immersed in a second bath (i.e. de-plating bath). The second bath comprises one or more acids such as sulfuric acid ($H_2SO_4$), hydrogen chloride (HCl), or the like, and a copper-containing compound, such as copper sulfate ($CuSO_4$) or copper fluoroborate ($CuB_2F_8$). The second bath does not comprise any additives, such as those described above with respect to the first bath. In some embodiments, the second bath comprises about 30 to about 85 grams/liter of copper sulfate ($CuSO_4$), about 50 to about 150 grams/liter of sulfuric acid ($H_2SO_4$), about 30 to about 150 parts per million of hydrogen chloride (HCl). In some embodiments, the substrate 200 is immersed in the second bath for a second period of time of about 1 to about 10 minutes.

At 110, a second electric current that is a reverse of the first electric current is applied between the conductive seed layer 206 plus the conductive material 212 and a second anode disposed in electrical contact with the second bath. In some embodiments, the second electric current is about 0.5 to about 20 Amps. The second electric current is provided by a power source such as DC power source. The de-plating process within the second bath at 108-110 serves to roughen the exposed surfaces of the conductive material 212, such as the sidewalls 216 and the top surface 218 of the conductive material 212.

Figure 2C:
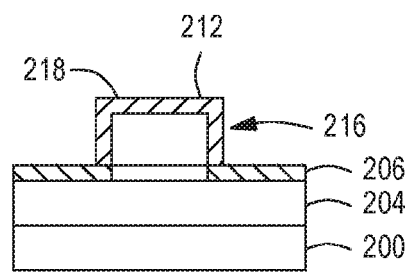

As described above, in some embodiments, the patterned photoresist layer 208 is stripped prior to immersing the substrate 200 in the second bath as described at 108. The substrate 200 is removed from the first bath and placed in a processing chamber suitable for stripping the patterned photoresist layer 208. Once the patterned photoresist layer 208 is stripped, the substrate 200 is placed in the second bath. As depicted in FIG. 2C, the sidewalls 216 and a top surface 218 of the conductive material 212 are roughened in the second bath. At the same time, the exposed portions of the conductive seed layer 206 may be partially etched and roughened within the second bath. The sidewalls 216 and top surface 218 of the conductive material 212 is roughened to about 50 nm to about 150 nm, using Rq (root-mean-square roughness) as a measuring metric.

Figure 2D:
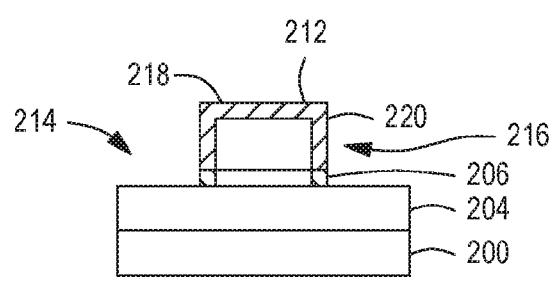

After forming the roughened surfaces 220 of the conductive material 212 and partially etching and roughening the exposed portions of the conductive seed layer 206, the portion of the conductive seed layer 206 from atop the field region 214 of the barrier layer 204 may not be fully removed and, if any portion of the conductive seed layer 206 atop the field region 214 remains, the portion must be etched separately. At 112, and as depicted in FIG. 2D, the substrate 200 is removed from the second bath and placed in a processing chamber suitable for etching any remaining portion of the roughened conductive seed layer 206 from atop the field region 214 of the barrier layer 204. The remaining portion of the conductive seed layer 206 from atop the field region 214 of the barrier layer 204 is etched using any suitable etching method used in semiconductor manufacturing processes, such as a wet etch using a dilute sulfur peroxide mixture. Etching the remaining portion of the roughened conductive seed layer 206 also results in some of the conductive material 212 being etched. However, the remaining portion of the roughened conductive seed layer 206 is less than about 100 nm thick. Accordingly, the amount of conductive material 212 being etched relative to the thickness of the conductive material 212 is within acceptable tolerances.

Figure 2E:
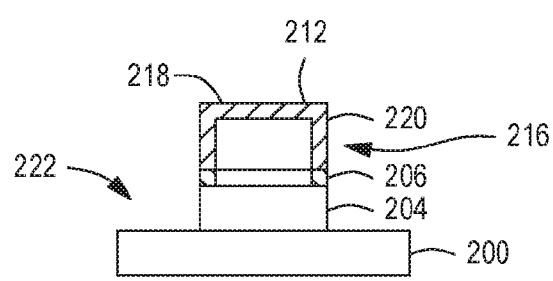

At 114, and as depicted in FIG. 2E, after etching the portion of the conductive seed layer 206 from atop the field region 214 of the barrier layer 204, the portion of the barrier layer 204 from atop the field region 222 of the substrates 200 is etched. The portion of the barrier layer 204 from atop the field region 222 of the substrates 200 is etched using any suitable etching method used in semiconductor manufacturing processes, such as a wet etch using dilute hydrogen fluoride (HF) or a mixture of hydrogen peroxide ($H_2O_2$), ammonium fluoride ($NH_4F$), and ammonium hydroxide ($NH_4OH$). Accordingly, the method 100 provides a roughened surface 220 of the conductive material 212 that provides improved adhesion to subsequently formed adjacent polymer layers. Following formation of the roughened surface 220, the method 100 ends and the substrate 200 may undergo further processing, such as spin-coating a polymer layer onto the conductive material 212, patterning and curing the polymer layer. The copper (Cu)/polymer build-up may be repeated to form a predetermined number of multilayers and as such, the method 100 is applicable to form any number of copper (Cu)/polymer individual stacks.

Figure 3A:
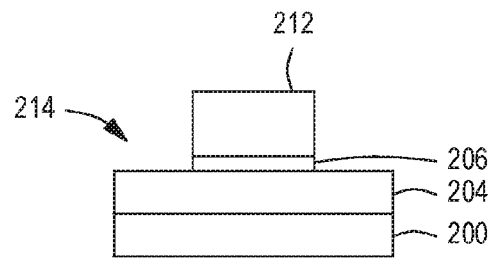
FIGS. 3A-3C depict a schematic side view of a substrate during different stages of processing a copper (Cu) surface to enhance polymer adhesion in accordance with some embodiments of the present disclosure.
Figure 3B:
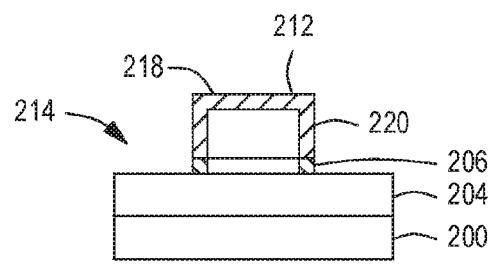
Figure 3C:
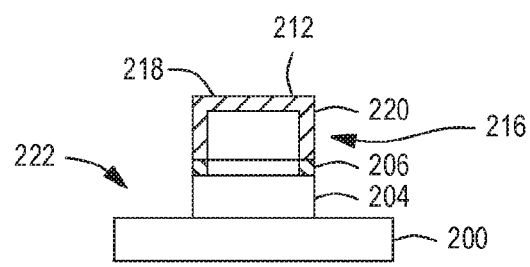

In some embodiments, as depicted in FIGS. 3A-3C, after the patterned photoresist layer 208 is stripped as depicted in FIG. 2B, and prior to immersing the substrate 200 in the second bath, the portion of the conductive seed layer 206 from atop the field region 214 of the barrier layer 204 is etched using any suitable etching method used in semiconductor manufacturing processes, such as wet etch using dilute sulfur peroxide mixture. As explained above, etching the portion of the conductive seed layer 206 also results in some of the conductive material 212 being etched. However, the amount of conductive material 212 being etched relative to the thickness of the conductive material 212 is within acceptable tolerances As depicted in FIG. 3B, after etching the portion of the conductive seed layer 206 from atop the field region 214 of the barrier layer 204, the substrate is immersed in a second bath and a second electric current that is a reverse of the first electric current is applied between the barrier layer 204 plus the conductive material 212 and a second anode disposed in electrical contact with the second bath as described at 108-110 above. Accordingly, as depicted in FIG. 3B, the sidewalls 216 and a top surface 218 of the conductive material 212 is roughened. By etching the portion of the conductive seed layer 206 from atop the field region 214 of the barrier layer 204 prior to performing 108-110, the sidewalls of the conductive seed layer 206 are also roughened. Furthermore, the etch of the conductive seed layer 206 can smoothen the surface of the conductive material. Accordingly, by etching the portion of the conductive seed layer 206 from atop the field region 214 of the barrier layer 204 prior to performing 108-110 the roughened surface 220 of the conductive material 212 will not be smoothened by the conductive seed layer 206 etch. After performing 108-110, the portion of the barrier layer 204 from atop the field region 222 of the substrates 200 is etched as depicted in FIG. 3C and described above.

As described above, in some embodiments as depicted in FIGS. 4A-4F, the patterned photoresist layer 208 is stripped after providing the second electric current. Stripping the patterned photoresist layer 208 after providing the second electric current is necessitated when plating co-planarity is sought, for example as discussed in commonly owned United States Patent Publication No. 2015/0225866 A1. FIG. 4A depicts a substrate 200 comprising a barrier layer 204 formed atop the substrate 200, a conductive seed layer 206 formed atop the barrier layer 204, a patterned photoresist layer 208 defining an opening 210 between the patterned photoresist layer 208 to expose the underlying layers such as the conductive seed layer 206, and a conductive material 212 deposited at the bottom of the opening 210. As depicted in FIG. 4B, the substrate 200 having the patterned photoresist layer 208 is immersed in a second bath and a second electric current that is a reverse of the first electric current is applied between the conductive seed layer 206 plus the conductive material 212 and a second anode disposed in electrical contact with the second bath as described at 108-110 above. However, the presence of the patterned photoresist layer 208 prevents the sidewalls of the conductive material 212 from being roughened. Accordingly, as depicted in FIG. 4B only a top surface 218 of the conductive material 212 is roughened.

As depicted in FIG. 4C, the patterned photoresist layer 208 is then stripped to expose the conductive seed layer 206 on the field region 214 of the barrier layer 204 and to expose the sidewalls 216 of the conductive material 212.

Figure 4D:
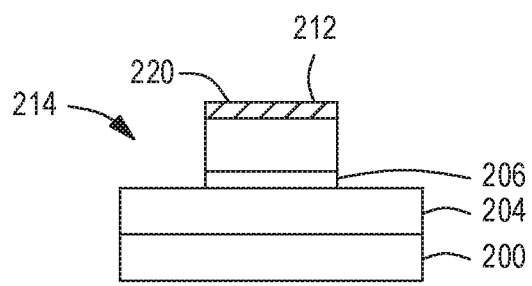
Figure 4E:
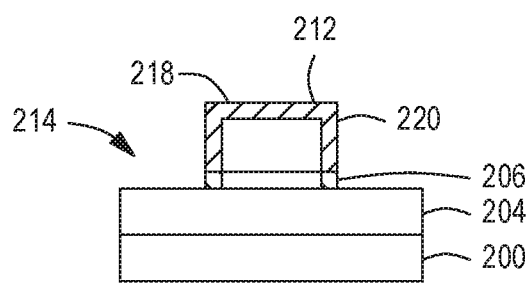
Figure 4F:
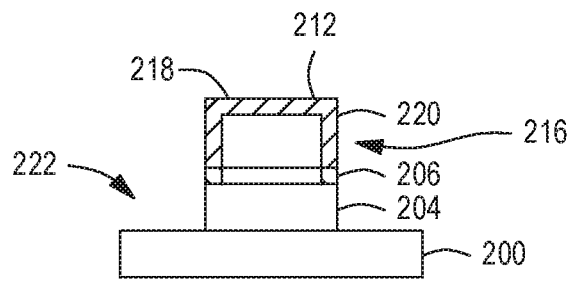

As depicted in FIG. 4D, after the patterned photoresist layer 208 is stripped, and prior to immersing the substrate 200 in the second bath, the portion of the conductive seed layer 206 from atop the field region 214 of the barrier layer 204 is etched as described above with respect to FIG. 2D. After etching the portion of the conductive seed layer 206 from atop the field region 214 of the barrier layer 204, the substrate 200 is immersed in a second bath and a second electric current that is a reverse of the first electric current is applied between the barrier layer 204 plus the conductive material 212 and a second anode disposed in electrical contact with the second bath as described at 108-110 above. Accordingly, as depicted in FIG. 4E, the sidewalls 216 and a top surface 218 of the conductive material 212 is roughened. After performing 108-110, the portion of the barrier layer 204 from atop the field region 222 of the substrates 200 is etched to a top surface of the substrate 200 as depicted in FIG. 4F.

While the foregoing is directed to embodiments of the present disclosure, other and further embodiments of the disclosure may be devised without departing from the basic scope thereof.

The invention claimed is:

1. A method of processing a substrate, comprising:
immersing a substrate in a first bath, wherein the substrate comprises a barrier layer, a conductive seed layer atop the barrier layer, and a patterned photoresist layer atop the conductive seed layer defining an opening formed to a top surface of the conductive seed layer, and wherein the first bath comprises a solution of at least one acid, a copper-containing compound, and at least one additive;
providing a first electric current between the conductive seed layer and a first anode disposed in electrical contact with the first bath to deposit a conductive material within the opening;
stripping the patterned photoresist layer to expose a portion of the conductive seed layer formed atop a field region of the barrier layer and to expose sidewalls of the conductive material;
immersing the substrate in a second bath, wherein the second bath comprises a solution of at least one acid and a copper-containing compound without any additives;
providing a second electric current that is a reverse of the first electric current between the conductive seed layer plus the conductive material and a second anode disposed in electrical contact with the second bath until at least one surface of the conductive material is roughened to an Rq of about 50 nm to about 150 nm;
etching the conductive seed layer from atop a field region of the barrier layer; and
etching the barrier layer from atop a field region of the substrate.

2. The method of claim 1, wherein the first bath comprises: copper sulfate ($CuSO_4$), sulfuric acid ($H_2SO_4$), hydrogen chloride (HCl), and one or more additives.

3. The method of claim 2, wherein the first bath comprises about 30 to about 85 grams/liter of copper sulfate ($CuSO_4$), about 50 to about 150 grams/liter of sulfuric acid ($H_2SO_4$), and about 30 to about 150 parts per million of hydrogen chloride (HCl).

4. The method of claim 2, wherein the substrate is immersed in the first bath for a first period of time of about 1 to about 10 minutes.

5. The method of claim 1, wherein the first electric current is about 0.5 to about 20 Amps.

6. The method of claim 1, wherein the second bath comprises: copper sulfate ($CuSO_4$), sulfuric acid ($H_2SO_4$), and hydrogen chloride (HCl).

7. The method of claim 6, wherein the second bath comprises about 30 to about 85 grams/liter of copper sulfate ($CuSO_4$), about 50 to about 150 grams/liter of sulfuric acid ($H_2SO_4$), about 30 to about 150 parts per million of hydrogen chloride (HCl).

8. The method of claim 1, wherein the second electric current is about 0.5 to about 20 Amps.

9. The method of claim 1, wherein the substrate is immersed in the second bath for a second period of time of about 1 to about 10 minutes.

10. The method of claim 1, further comprising removing the substrate from the first bath and stripping the patterned photoresist layer prior to immersing the substrate in the second bath.

11. The method of claim 10, further comprising etching the conductive seed layer from atop a field region of the barrier layer after etching the patterned photoresist layer and prior to immersing the substrate in the second bath.

12. A method of processing a substrate, comprising:
immersing a substrate in a first bath, wherein the substrate comprises a barrier layer, a conductive seed layer atop the barrier layer, and a patterned photoresist layer atop the conductive seed layer defining an opening formed to a top surface of the conductive seed layer, and wherein the first bath comprises a solution of at least one acid, a copper-containing compound, and at least one additive;
providing a first electric current between the conductive seed layer and a first anode disposed in electrical contact with the first bath to deposit a conductive material within the opening;
removing the substrate from the first bath;

stripping the patterned photoresist layer prior to immersing the substrate in a second bath to expose a portion of the conductive seed layer formed atop a field region of the barrier layer and to expose sidewalls of the conductive material;

immersing the substrate in the second bath, wherein the second bath comprises a solution of at least one acid and a copper-containing compound without any additives;

providing a second electric current that is a reverse of the first electric current between the conductive seed layer plus the conductive material and a second anode disposed in electrical contact with the second bath;

etching the conductive seed layer from atop a field region of the barrier layer after etching the patterned photoresist layer and after providing the second electric current; and etching the barrier layer from atop a field region of the substrate.

13. The method of claim 1, further comprising performing the stripping of the patterned photoresist layer after providing the second electric current.

14. The method of claim 13, further comprising: etching the conductive seed layer from atop a field region of the barrier layer after stripping the patterned photoresist layer and prior to immersing the substrate in the second bath.

15. A method of processing a substrate, comprising:
immersing a substrate in a first bath comprising copper sulfate ($CuSO_4$), sulfuric acid ($H_2SO_4$), hydrogen chloride (HCl), and one or more additives, wherein the substrate comprises a barrier layer, a conductive seed layer atop the barrier layer, and a patterned photoresist layer atop the conductive seed layer defining an opening formed to a top surface of the conductive seed layer;

providing a first electric current between the conductive seed layer and a first anode disposed in electrical contact with the first bath to deposit a conductive material within the opening;

stripping the patterned photoresist layer prior to immersing the substrate in a second bath to expose a portion of the conductive seed layer formed atop a field region of the barrier layer and to expose sidewalls of the conductive material;

etching the conductive seed layer from atop a field region of the barrier layer;

immersing the substrate in the second bath comprising copper sulfate ($CuSO_4$), sulfuric acid ($H_2SO_4$), and hydrogen chloride (HCl) without any additives;

providing a second electric current that is a reverse of the first electric current between the barrier layer plus the conductive material and a second anode disposed in electrical contact with the second bath; and etching the barrier layer from atop a field region of the substrate.

16. The method of claim 15, further comprising etching the conductive seed layer from atop a field region of the barrier layer after stripping the patterned photoresist layer and prior to immersing the substrate in the second bath.

17. The method of claim 15, further comprising etching the conductive seed layer from atop a field region of the barrier layer after stripping the patterned photoresist layer and after providing the second electric current.

18. The method of claim 15, wherein the one or more additives in the first bath comprise one or more of at least one accelerator-suppressor, and at least one leveler.

19. A method of processing a substrate, comprising:
immersing a substrate in a first bath comprising copper sulfate ($CuSO_4$), sulfuric acid ($H_2SO_4$), hydrogen chloride (HCl), and one or more additives, wherein the substrate comprises a barrier layer, a conductive seed layer atop the barrier layer, and a patterned photoresist layer atop the conductive seed layer defining an opening formed to a top surface of the conductive seed layer;

providing a first electric current between the conductive seed layer and a first anode disposed in electrical contact with the first bath to deposit a conductive material within the opening;

immersing the substrate in a second bath comprising copper sulfate ($CuSO_4$), sulfuric acid ($H_2SO_4$), and hydrogen chloride (HCl) without any accelerators, suppressors, or levelers;

providing a second electric current that is a reverse of the first electric current between the conductive seed layer plus the conductive material and a second anode disposed in electrical contact with the second bath;

stripping the patterned photoresist layer after providing the second electric current to expose a portion of the conductive seed layer formed atop a field region of the barrier layer and to expose sidewalls of the conductive material;

etching the conductive seed layer from atop a field region of the barrier layer after stripping the patterned photoresist layer;

immersing the substrate in the second bath and providing the second electric current that is a reverse of the first electric current between the barrier layer plus the conductive material and the second anode disposed in electrical contact with the second bath after etching the conductive seed layer; and etching the barrier layer from atop a field region of the substrate.

20. The method of claim 19, wherein the substrate is immersed in the first bath for a first period of time of about 1 to about 10 minutes and wherein the substrate is immersed in the second bath for a second period of time of about 1 to about 10 minutes.

* * * * *